United States Patent [19]

Ulrich et al.

[11] Patent Number: 4,539,519

[45] Date of Patent: Sep. 3, 1985

[54] FIBER OPTICS DEVICE FOR MEASURING THE INTENSITY OF AN ELECTRIC CURRENT UTILIZING THE FARADAY EFFECT

[75] Inventors: Reinhard Ulrich, Buchholz, Fed. Rep. of Germany; Scott C. Rashleigh, Alexandria, Va.

[73] Assignee: Max-Planck-Gesellschaft zur Forderung der Wissenschaften e.V., Fed. Rep. of Germany

[21] Appl. No.: 371,203

[22] Filed: Apr. 23, 1982

[30] Foreign Application Priority Data

Apr. 23, 1981 [DE] Fed. Rep. of Germany ....... 3116149

[51] Int. Cl.³ .................... G01R 33/00; G01R 19/00
[52] U.S. Cl. .................................. 324/117 R; 324/96; 350/375
[58] Field of Search ............... 324/96, 117 R; 332/7.51; 350/375, 376, 378, 387, 355, 356

[56] References Cited

U.S. PATENT DOCUMENTS 3,495,189 2/1970 Le Craw ............................ 332/7.51
3,506,929 4/1970 Ballman et al. ..................... 332/7.51
4,255,018 3/1981 Ulrich et al. ......................... 324/96

Primary Examiner—Ernest F. Karlsen
Attorney, Agent, or Firm—Antonelli, Terry & Wands

[57] ABSTRACT

In order to measure the intensity of an electric current utilizing the Faraday effect, an optical path which is exposed to a magnetic field generated by the current is marked by an optical fiber which is laid in a number of windings in the shape of a coil. In order to minimize the disruptive effect of, for instance, elliptical eigen-birefringence of the fiber, or birefringence caused by the laying of the fiber on the zero point and the calibration factor of the device, the end of the optical fiber which is away from the input point is provided with a reflection unit which reflects back into the fiber the light which arrives there with the same polarization state with which it arrived at the reflection unit. A polarization measurement unit is used to record the polarization state of light flux which, after having traversed the optical fiber a total of twice, again emerges at the input point. The current intensity can then be derived from the change in the polarization state compared to the light which was input into the optical fiber at the input point.

16 Claims, 5 Drawing Figures

FIBER OPTICS DEVICE FOR MEASURING THE INTENSITY OF AN ELECTRIC CURRENT UTILIZING THE FARADAY EFFECT

BACKGROUND OF THE INVENTION

The present invention pertains to a class of device for measuring the intensity of an electric current utility the Faraday effect with an optical fiber which surrounds the current path in a number of windings and which marks an optical path which is exposed to the magnetic field of the current. The optical fiber is guiding a light flux which has a defined polarization state and which undergoes a current-dependent change in its polarization state along this optical path due to the Faraday effect. A polarization measurement unit is then used to record the polarization state of the light after it traverses the optical path and to produce a measurement signal which is characteristic of the current intensity.

A general device of this type is taught, for example, in De-AS No. 28 35 794. In this reference, the optical fiber is wound in N-windings around the electrical conductor in which the electric current to be measured flows. The set of windings is positioned such that the optical path runs, in a very good approximation, in the direction of the components of the magnetic field H generated by the current to be measured. These components surround the conductor in a circular shape. Light of a defined polarization state, in general linearly polarized light, is applied to the fiber, and the polarization state of the light is measured after it traverses the optical path. The magnetic field connected to the current flowing in the conductor causes a Faraday rotation of the polarization plane of the light, the value of which is given by the relation:

$$\theta = NVI$$

with the given winding geometry and, in the assumed ideal case, where the fiber is free of disturbing birefringence effects or the disturbing influence of these effects is suppressed, where $\theta$ is the Faraday rotation, N is the number of windings, I is the current intensity and V is the Verdet constant of the fiber material. The rotation $\theta$ of the polarization plane of the light exiting at the end of the fiber is measured and analyzed by opto-electronic means and is displayed directly in units of current intensity I. The measurement of the current intensity is thus related to the recording of the rotation $\theta$ of the polarization plane of the measurement light. The rotation results from the circular birefringence which is generated along the optical path, this birefringence being induced by the Faraday effect and thus being proportional to the current.

For a qualitative elucidation of the measurement problem, let us first refer to the so-called Poincare sphere representation in which the possible linear polarization states of the measurement light are represented by the points on the equator, the two possible purely circular polarization states are represented by the north pole (left-handed circular polarization L) and the south pole (right-handed circular polarization R) and the possible elliptical polarization states of the measurement light are represented by the other points on the surface of a sphere. A linear birefringence $\beta$ which is present in the optical fiber can be depicted in this representation by a vector which lies in the equatorial plane and the direction of which vector $2\theta_B$ marks two polarization eigen-states (sometimes referred to as inherent states of natural states) which lie at diametrically opposing points on the equatorial line. If these states are input into the optical fiber, then over its length there would occur no change in the polarization state if only the linear birefringence represented by this vector were present. The length of this vector is a measure of the value of this birefringence. By the same token, a circular birefringence which is present in the optical fiber or is imposed on it in some other way, as well as circular birefringence $\alpha_H$ induced by the Faraday effect, can be represented by a vector which points in the direction of the polar axis of the Poincare sphere. If both linear birefringence and circular birefringence are present, i.e., if overall there is elliptical birefringence, then its polarization eigen-states are given by the direction of the vector $\vec{\omega}$ which is the result of the vector sum of the linear birefringence vector $\vec{\beta}$ and the circular birefringence vector $\vec{\alpha}$.

Viewed along the optical path, in this representation the polarization state of measurement light which is input into the fiber and which has a polarization state other than that which corresponds to the eigen-polarization states undergoes an evolution along a circle on the sphere surface which runs concentrically around the direction marked by the respective birefringence vector $\vec{\alpha}$, $\vec{\beta}$ or $\vec{\omega}$. This circle originates from the point on the sphere surface represented by the polarization state of the input light and is traversed at an angular frequency for which the "length" of the respective birefringence vector is a measure (see FIG. 4).

Starting with the ideal case where the fiber features no linear birefringence and where the measurement light input into the fiber has the H polarization state (i.e., horizontal polarization), in the Poincare sphere represented a $2\theta$ arc of the equator corresponds to a Faraday-effect-induced rotation of the polarization plane which occurs along the optical fiber. The end point $C_L$ of this arc represents the initial polarization state of the measurement light with which the light emerges at the end of the optical fiber which is far from the input point.

In reality, however, there is no optical fiber which is completely free of birefringence. Rather, a real fiber always has more or less intense linear and/or circular or elliptical eigen-birefringence which can result from, for example, deviations in the fiber core from the ideal cross-sectional shape, unilateral elastic stresses in the fiber and circular birefringence caused by twisting of the fiber. The consequence of this is that even when the conductor surrounded by the fiber carries no current, the output polarization state $C_L$ of light which has traversed the fiber does not coincide with the input polarization state H with which it was input into the fiber. Rather, this output light has some elliptical output polarization state which is represented by a point on the Poincare sphere which lies above or below the equator. The curve C(z), which connects point H with point $C_L$ on the Poincare sphere and which describes the development of the polarization state along the fiber from its input point where the light enters with the polarization state H to its end where the exiting light has the "elliptical" polarization state $C_L$, therefore generally deviates more or less from the equator. In this process this curve C(z) usually also has a complex shape due to unavoidable irregularities in the fiber. In addition, the polarization development along the fiber, and thus the curve C(z) which reflects this on the Poincare sphere, will change in the presence of temperature variations, shocks and, under certain circumstances, aging of the fiber since these effects influence the eigen-birefringence of the fiber. As a consequence, the zero point and the calibration factor of the current measurement device which contains such a fiber as an optical path is subject to fluctuations since, for instance, a temperature-induced shift in the output polarization state $C_L$ of the measurement light cannot be distinguished from a change caused by Faraday rotation of the polarization plane. The variations in the calibration factor are due to the fact that the Faraday rotation has different effects at a point Z on the curve, depending on whether the corresponding polarizatin state C(z) is linearly polarized, i.e., whether it lies on the equator of the Poincare sphere or elliptically polarized (i.e., lies above or below the equator).

SUMMARY OF THE INVENTION

An object of the present invention is thus to create a device of the type mentioned above which minimizes those variations in the zero point which limit sensitivity as well as minimizing variations in the calibration factor.

To achieve this and other objects, in the area of the end of the optical fiber away from the input point, a reflection unit is provided which reflects the light which arrives at this end with the same polarization state as it had when it entered the reflection unit. The polarization measurement unit then records the polarization state of the light which re-exits at the input point after it has been subjected to reflection at the reflection unit and has traversed the optical path a total of two times.

On the condition that a beam of light which emerges at the end of the fiber is reflected back into itself, the term "the same polarization state" in this case is to be defined as follows:

(a) If the emerging light is linearly polarized, then the reflected light should also be linearly polarized and have the same direction of oscillation in space, i.e., the E vectors of the light emerging at the end of the fiber and of the light re-entering the fiber should be parallel. This requirement for the reflection unit is fulfilled by, for instance, a planar mirror in the case of linear polarization.

(b) In the case of elliptical polarization:
1. The reflected light should have the same ellipticity as the incident light, i.e., in both light currents the ratio of the major axis to the minor axis of their oscillation ellipses should coincide,
2. The direction of the major axis of the oscillation ellipse of the reflected light should coincide with that of the light which is incident on the reflection unit, and
3. The of rotation of the polarization of the reflected light should coincide with that of the incident light, where the term "direction of rotation" is to be understood in the same way for both beams such that an observer who determines the direction of rotation is facing towards the direction of propagation of the corresponding light beam. This definition of the direction of rotation corresponds to the normal definition. If, on the other hand, we refer the directions of rotations of the polarizations of the incident and reflected beams jointly to the direction of propagation of one of the two beams, then these directions of rotation must oppose one another.

(c) If the polarization state of the light beam which emerges at the end of the fiber is circular, then requirement (b) (2) is dropped.

Assuming that the polarization state $C_R$ of the reflected light returning into the fiber coincides exactly with the polarization state $C_L$ of the light which is emerging at the reflection-side end of the fiber, the device as described by the invention will provide the following significant advantages:

1. Absolute constancy of the zero point of current measurement for any values of the fiber eigen-birefringence since birefringence caused by geometricand/or elastic fiber imperfections is reciprocal.

2. Doubling of the sensitivity $\theta/I$ since the Faraday rotation is non-reciprocal and therefore the Faraday rotations on the way of the light "out" and "back" in the optical fiber are added.

For the case where the optical fiber features only a slight linear, circular or elliptical birefringence such that the development of the polarization state of the light which is input at the start of the fiber (z=0), reflected at the end of the fiber (z=L) and again output at the beginning of the fiber again runs over curve C(z) in the immediate vicinity of the equator of the Poincare sphere, and does so when changes in the eigen-birefringence occur due to the above-mentioned distorting effects, the above-mentioned requirement (a) can be fulfilled with a planar mirror as a reflector which is mounted at the end of the fiber z=L. In this case, in particular, as required, the light which arrives at z=L is linearly polarized in a good approximation, and so also is the light reflected from the mirror, with the same azimuth as the incoming light. If the polarization state of the reflected light is designated $C_R$, then accordingly $C_R = C_L$.

This relationship is not, however, generally valid, but is applicable only in the case assumed up till now, where the measurement light is linearly polarized. In the general case where the polarization state $C_L$ at the end of the fiber is an arbitrary, elliptically polarized state, when the light is reflected at a planar mirror, the azimuth of the polarization remains the same but the direction of rotation (right-handed/left-handed) of the polarization is reversed. If we use $\overline{C_L}$ to designate the polarization state resulting from the reflection of the polarization state $C_L$ at a planar mirror, then we have: $C_R = \overline{C_L}$. In the Poincare sphere representation, the polarization state $\overline{C_L}$ is obtained by reflection of the polarization state $C_L$ at the equatorial plane. Since in the case of a planar mirror (and with all other reflectors which are permanently composed in some way of reflecting surfaces which are invariant over time and thus can be regarded as passive) $C_R \neq C_L$ is thus generally valid, when the light propagates in the reverse direction there is necessarily a different polarization development from that which occurs in the forward direction (from z=0 to z=L). The final polarization state $C_1$ which can be output from the fiber z=0 and which results from the reflected polarization state $C_R = \overline{C_L}$ at z=L is generally different from the initial state C (0)=H which is input into the fiber at z=0, because only the polarization state $C_L$ would, at z=L input into the fiber, again lead to the final state corresponding to the initial state L when z=0.

In FIG. 4 showing the Poincare sphere representation, it thus becomes clear that when the final polarization state $C_L$ lies in the immediate vicinity of the equator, and thus the angular distance $C_L C_R$ and, therefore, the angular distance $HC_1$ move toward zero, the final polarization state $C_1$ which can be output at the start of the fiber corresponds to the initial polarization state H which is input at that point when there is no current flowing.

The assumption that (again referring to FIG. 4 showing the Poincare sphere representation) the polarization state $C_L$ varies only along and in the immediate vicinity of the equatorial plane of the Poincare sphere is applicable only to the case where a change in the fiber's eigen-birefringence caused by the above-mentioned disturbances is purely circular and is due solely to, twisting of the fiber. In general, however, there is also a linear portion of eigen-birefringence which has the effect that the final polarization state $C_L$ has a non-neligible angular distance from the equatorial plane of the Poincare sphere so that $C_R \neq C_L$ and thus the final polarization state $C_1$ of the light which can be output at the start of the fiber is significantly different from the polarization state H. Because of the sensitivity of this eigen-birefringence to disruptions such as temperature changes, there is also a zero point temperature drift of the current measurement device since the electronic analysis system cannot distinguish changes in the final polarization state $C_1$ caused by such disruptive influences from those which are due to a change in this polarization state $C_1$ caused by the current I. With the temperature, the calibration factor of the current meter also changes because on the light's way "out" and "back" the polarization states $C(z)$ traverse different (temperature-dependent) paths on the Poincare sphere on which the Faraday effect is exerted to differing extents.

These difficulties can be avoided by using, within the framework of the device as described by the invention, a reflection unit which responds as an "active" reflector which reflects any polarization state $C_L$ which arrives at the end of the fiber so as to maintain its polarization, i.e., which inputs the measurement light back into the fiber with exactly this polarization state $C_L$ at the end of the floor.

In accordance with other aspects of the present invention, simple structures are provided for the fiber optics current measurement device as described by the invention, the reflection unit of which is designed as an active element which, when there are changes in the polarization state $C_L$ which arrives at the reflection unit, modifies its internal state, so to speak, and adapts to the altered polarization state $C_L$ in such a way that $C_L = C_R$ is again obtained. The appropriate adaptation of the polarization state $C_R$ of the reflected light to that ($C_L$) of the light which arrives at the end of the fiber is ensured in this case by a polarization control circuit which works in such a way that the final polarization state $C_L$ is stabilized at linear polarization, with the particular advantage that, in that case, within the framework of the adaptive reflection unit, a mirror (preferably a planar one) can then be used as a reflection element.

A prerequisite is, of course, that the control circuit which is provided within the framework of the reflection unit be able to adjust quickly enough to the polarization state $C_L$ which arrives in each case at the end of the fiber. However, in the presence of the above-mentioned disruptive influences (temperature changes, shocks, aging), this prerequisite can be met in practice since adjustment times in the range of 1 msec are technically possible with available polarization servo components.

In accordance with the simple structure of the fiber optics device of the present invention, advantageous designs for the reflection element as a partially reflecting mirror and of the polarization control circuit which is provided within the framework of the reflection unit can be provided.

Also, pressure servo components can be provided which can be used alternatively, or an electro-optical servo component can be utilized to obtain particularly fast response behavior.

BRIEF DESCRIPTION OF THE DRAWINGS

Further details and features of the invention are indicated by the following description of practical examples illustrated by the drawings, wherein.

DETAILED DESCRIPTION

Figure 1:
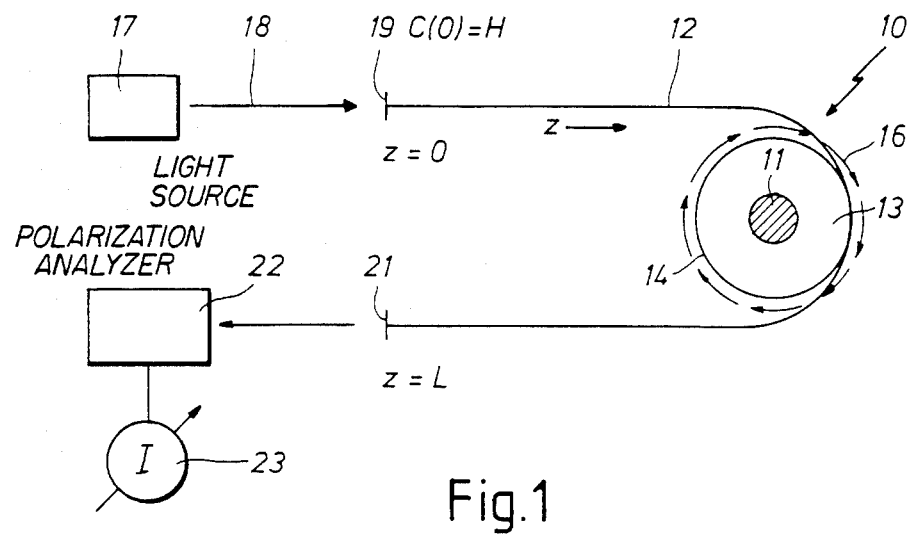
FIG. 1 shows the basic structure of a known fiber optics current measurement unit, to illustrate the state of the art.

Referring to the drawings, FIG. 1 shows the basic structure of a known fiber optics device 10 in which the intensity of an electric current I flowing in a conductor 11 can be measured utilizing the magneto-optical Faraday effect. The essential element in device 10 is an optical fiber 12 which, when wound onto, for instance, a coil form 13 through which the conductor runs in the axial direction, surrounds conductor 11 with a number N of closely packed windings 14. Windings 14 are arranged close together so that the magnetic field H which surrounds conductor 11, which is represented by arrows 16 and which is connected to the current I flowing through conductor 11, runs, in a very good approximation, in the direction of the optical path marked by windings 14 of fiber 12. A light flux which is emitted from a light source 17, which is represented by arrow 18 and which may have a defined linear polarization state (without restricting generality, it will be assumed for the following that this is to be the state of horizontal linear polarization (H)) is input into fiber 12 at the beginning of the fiber 19, i.e., at $z=0$. Measurement between the start of the fiber 19 and the end of the fiber 21, this fiber can have a total length of L where most of this length is accouned for by windings 14 which are wound onto coil form 13. Under the action of magnetic field 16 which is connected to current I, the polarization plane of the measurement light running from the beginning of the fiber 19 to the end of the fiber 21 undergoes a current-proportional Faraday rotation. This rotation is recorded by a polarization analyzer 22, by which it is converted into an electrical output signal which is characteristic of the recorded polarization state and is directly displayed on a display 23 in units of current intensity. The optical fiber 12 is assumed to be a solid-core fiber made of silica which may have a non-negligible proportion of linear or elliptical birefringence $\beta$ or $\omega$.

Figure 4:
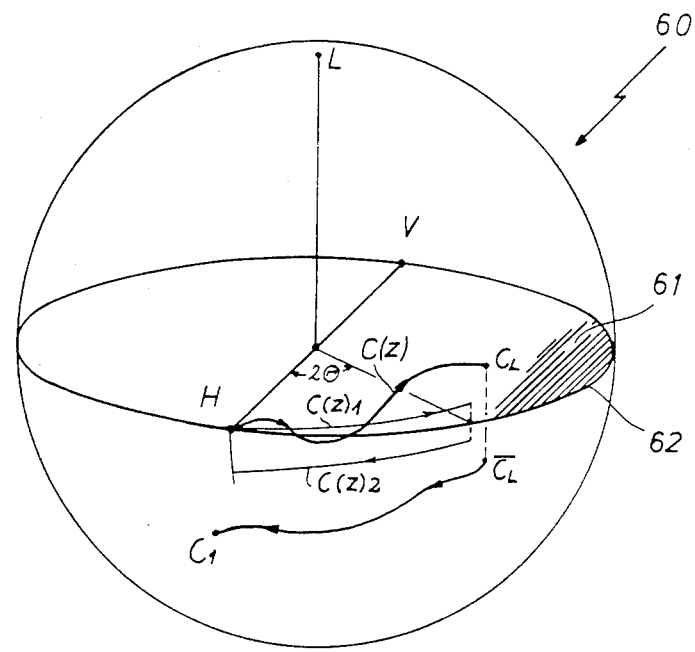
FIG. 4 shows a Poincare sphere to illustrate the function of the known fiber optics device and the device described by the present invention in accordance with FIGS. 1, 2, 3 and 4.

The difficulties regarding the zero point stability of the measurement device, and thus its sensitivity, caused by the birefringence of the fiber in such a known fiber optics device 10, are explained in detail in the foregoing description regarding the Poincare sphere representation of FIG. 4.

Figure 2:
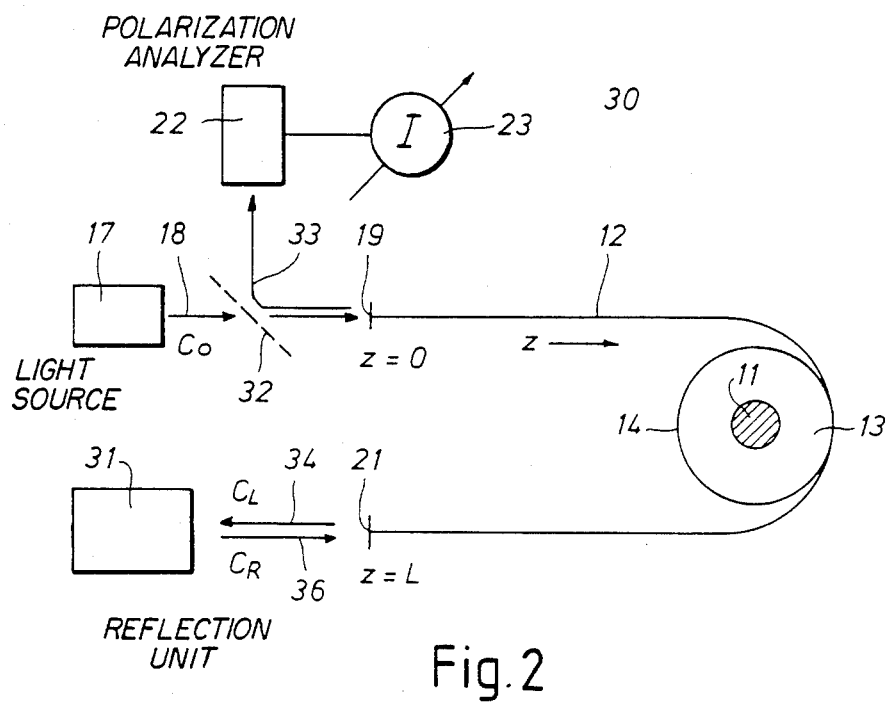
FIG. 2 shows an initial practical example of a fiber optics device in accordance with the present invention.

FIG. 2 shows a fiber optics measurement device 30 in accordance with the present invention in which these difficulties are avoided, at least for the case where the optical fiber which marks the optical path of the measurement light and is exposed to the current-proportional magnetic field exhibits such low birefringence that, in the case where there is no current, the development of the polarization state of the light propagating in the fiber is completed in the immediate vicinity of equatorial plane 61 of Poincare sphere 60 as shown in FIG. 4, for instance, along curves $C(z)_1$ or $C(z)_2$.

In the case of device 30 in accordance with FIG. 2, the same device and the same method of laying the optical fiber 12 on a coil form 13 are provided as in the case of device 10 in accordance with FIG. 1. Accordingly, in FIG. 2 the components and functional parts which correspond to those in FIG. 1 are given the same reference numbers.

Device 30 is essentially distinguished from that shown in FIG. 1 by the fact that there is a reflection unit 31 which reflects the light back into the fiber with a polarization state $C_R$ after the light has emerged with polarization state $C_L$ at end of fiber 21 after traversing optical fiber 12. Also, in FIG. 2, the analyzer display elements 22 and 23 are located in the area of the input-side fiber end 19 and receive, as the measurement light, a part of the light flow attended by polarization state $C_1$ and represented by arrow 33 via a beam splitter. After traversing the optical fiber 12 twice (out and back), this light current results from the input light current 18 which has a horizontal polarization state $C_0$. The reflection unit 31 in device 30 is a planar mirror so that $C_R = \overline{C_L}$.

If, as assumed, the linear or elliptical birefringence of optical fiber 12 is small enough, the polarization state $C_L$ of the light current which emerges at fiber end 21 after going out, which is represented by arrow 34, is equal, in a very good approximation, to the polarization state $C_0$, which is assumed to be linear-horizontal, of primary light current 18 emitted by light source 17. Thus, it is also equal to the polarization state $C_R$ of the light current which is reflected back by planar mirror 31 into optical fiber 12, which is represented by arrow 36, since a linear polarization state is not altered by reflection at a planar mirror. Accordingly, the polarization state $C_1$ of light current 33 which is fed via the beam splitter 32 to analyzer 22 is linear, at least when conductor 11 is not energized, since, as mentioned in the introduction, the birefringence caused by geometric and elastic distortion of fiber 11 is reciprocal.

Within the framework of the indicated approximation, i.e., a tolerable slight deviation of the polarization state variation curves C(z) from the equator 62 of Poincare sphere 60 (these curves reflect the development of the polarization state C(z) of the measurement light on its way out and back), a rotation $H \rightarrow C_L$ due to the birefringence of the fiber on the light's way out is again eliminated by the rotation on the way back, at least in the non-energized state. The consequence is an advantageously increased zero-point stability. The reason for this is that, as explained in the introduction, the birefringence caused by geometric and elastic fiber imperfections is reciprocal. On the other hand, the Faraday rotation of the polarization plane of the measurement light which is caused by the magnetic field of current I is non-reciprocal. Therefore, the Faraday rotations which result on the measurement light's way out and back are added and thus the sensitivity $\theta/I$ for device 30 is doubled due to the double use of the optical path marked by fiber 12.

Figure 3:
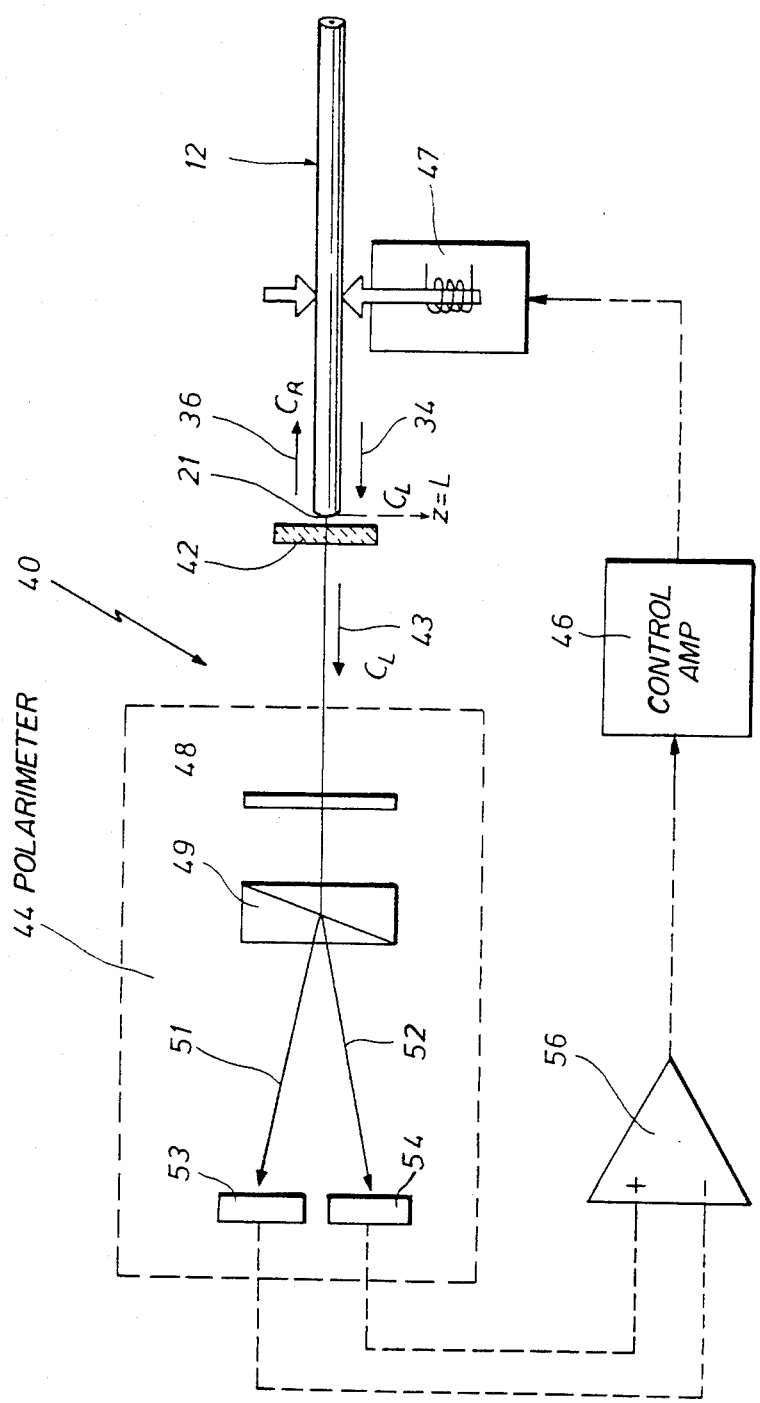
FIG. 3 shows a preferred practical example of a fiber optics device in accordance with the present invention utilizing an adaptive reflection unit.

The fiber optics device 40, which is described in the invention and which is depicted in FIG. 3, is essentially distinguished from that shown in FIG. 2 solely by the fact that a control circuit, indicated generally by numeral 40, is provided which keeps the polarization state of the measurement light current 34 emerging at fiber end 21 in the linear polarization state $C_L$, and this state, in turn, is assumed to be the state of horizontal linear polarization. The reflection element is a partially reflective and planar mirror 42. Accordingly, the light current 36 reflected back into fiber 12 has the polarization state $C_R = C_L$. The partially reflective planar mirror 42 is assumed to have a reflectivity of approximately 99% light's a transmission of approximately 1%. The partial light flux which is transmitted by this mirror and is indicated by arrow 43 has the same polarization state $C_L$ as light current 34 which emerges at the end of the fiber and which is supposed to be stabilized to a linear polarization state.

Within the framework of regulator circuit 40 there is included a polarimeter, designated generally by numeral 44, which analyzes the partial light current 43 transmitted by mirror 42 for its left-handed and right-handed polarized portions. This polarimeter generates an electrical output signal which disappears when its input light current 43 has a linear polarization state and which increases in the positive or negative direction as the deviation from a linear polarization state increases.

If the polarization state of the input light current 43 of polarimeter 44 deviates from linear polarization, then the output signal of polarimeter 44 which is proportional to the deviation is used as an error signal which, via an appropriate control amplifier 46, acts on a polarization servo component 47 until input light current 43 of polarimeter 44 and thus light current 34 striking mirror 42 and light current 36 reflected back by it are again linearly polarized. It should be noted that in this process the azimuth of the polarization state is of no importance.

In the practical example depicted here, polarimeter 44 comprises a $\lambda/4$ plate 48 and a Wollaston prism 49, the axes of which are offset by 45° with respect to one another. Thus, the intensity of one of the two output light beams 51 and 52 of the Wollaston prism corresponds to the left-handed circularly polarized portion of light current 43 and the intensity of the other output light beam corresponds to the right-handed circularly polarized portion of this light current 43. The output light currents 51 and 52 are measured by a photodiode 53, 54 respectively, and their output voltages are fed to a differential amplifier 56 as input signals. The output voltage of this differential amplifier 56 is the previously mentioned error signal which disappears when input light current has linear polarization state $C_L$.

Via control amplifier 46, which preferably features PI/control behavior, this error signal is fed to polarization servo component 47. The polarization servo component acts on the end section of fiber 12 which is adjacent to fiber end 21 and, as a function of the output signal emitted by control amplifier 46, generates in the end section a linear birefringence by which the polarization state of light current 34 exiting at the end of the fiber can be modified as desired.

Polarization servo component 47 can easily be designed as an electromagnetically or piezoelectrically actuated pressure device with which a transverse pressure force can be exerted on the end section of optical fiber 12. This force is composed additively of a constant stress bias and a variable quantity which is proportional to the error signal of control amplifier 46, with this latter quantity having a sign which varies depending on the direction of the necessary control. Polarization servo component 47 can be, for instance, a servo component which is described in "Applied Physics Letters", Vol. 35, p. 840, in connection with stabilization to a certain polarization state. In the case of device 40 as shown in FIG. 3, however, it is not necessary to stabilize to a precisely defined polarization state, for instance, polarization state H. Instead, it is sufficient to adjust the polarization state of light current 34 to linear polarization of any azimuth. The polarization servo component acts on the end section of fiber 12 which is adjacent to fiber end 21 and, as a function of the output signal produced by control amplifier 46, generates a linear birefringence with which the polarization state of light current 34 emerging at the fiber end can be modified as desired.

Although FIG. 3 illustrates the polarimeter 44 operating in conjunction with light passed through the partially reflective mirror 42, it is to be understood that it could also operate in conjunction with the light reflected from the mirror 42, if desired.

Figure 5:
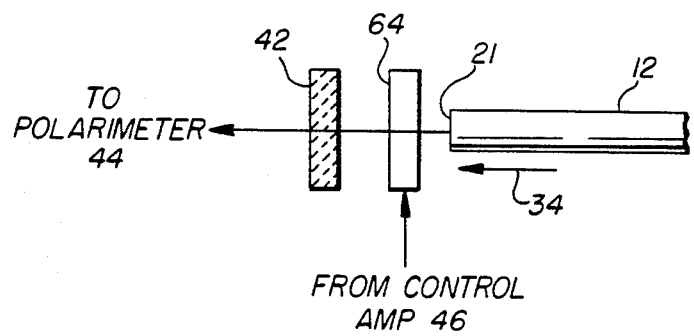
FIG. 5 shows an alternative servo arrangment in accordance with the present invention.

Also, although FIG. 3 illustrates the servo component 47 in terms of a pressure device for the fiber itself, it is to be understood that alternative servo components could be used. Thus, as shown in FIG. 5, an electro-optical element 64 with electrically controllable birefringence (e.g., an LiNbO₃ crystal) could be located between the end 21 of the fiber and the mirror 42 with its optical axis at right angles to the light 34 emerging from the fiber to provide the servo control. This could be accomplished by applying the error signal control from the control amplifier 46 along the optical axis of the electro-optical element.

It is to be understood that the above-described arrangements are simply illustrative of the applications of the principles of this invention. Numerous other arrangements may be readily devised by those skilled in the art which embody the principles of the invention and fall within its spirit and scope.

We claim:

1. A fiber optics device for measuring the intensity of an electric current along a current path using the Faraday effect, said device including an optical fiber having first and second ends which fiber surrounds the current path in a number of windings to mark an optical path which is exposed to the magnetic field of the current, wherein when a light flux generated by a light source and having a defined polarization state is fed into the fiber at its first end, a current-dependent alteration of this polarization state is produced along this optical path because of the Faraday effect, and wherein said device further includes a polarization measurement unit by which the polarization state of the light can be detected after it has traversed the optical path subjected to the magnetic field, and by which a polarization measurement signal characteristic of the current intensity can be generated, wherein the device further comprises an adaptive reflection unit located, substantially, at the second end of the optical fiber which reflection unit comprises a partially transparent mirror reflecting a first part of the light emerging from the second end back into the fiber, and transmitting a second part of the light emerging from the second fiber end to an analyzer unit which detects the polarization state of said second part of the light which is transmitted by the mirror and generates an output signal which is characteristic of this polarization state, and wherein the reflection unit further comprises a polarization servo means which receives the output signal of the analyzer unit as a control signal and which acts on the optical fiber to adjust the polarization state of the light emerging from the second end of the fiber to maintain the polarization state of the light transmitted and reflected by the mirror at a linear polarization state.

2. A fiber optics device in accordance with claim 1, wherein the analyzer unit includes means to generate said output signal with a characteristic related to the component of the circular polarization of the light current which emerges from the second end of the fiber, and wherein the output signal is fed as an error signal to said polarization servo means to stabilize the polarization state of the light exiting from the fiber to a linear polarization by controlling the polarization servo means in accordance with said error signal.

3. A fiber optics device in accordance with claim 2, wherein said mirror is located adjacent the second end of the fiber and comprises a semireflecting mirror, wherein said analyzer unit records the polarization state of the light transmitted by the mirror, and wherein the polarization servo means is a control device which affects the birefringence property of the fiber at its second end.

4. A fiber optics device in accordance wih claim 3, wherein the reflectivity of said semireflecting mirror is between 90% and 99%.

5. A fiber optics device in accordance with claim 2 or 3, wherein the analyzer unit generates one output signal which is proportional to the left-handed circularly polarized portion of the light and a second output signal which is proportional to the right-handed circularly polarized portion of the light, and wherein the improvement further comprises a differential amplifier coupled between said analyzer unit and said polarization servo means to receive the two output signals of the analyzer unit as its input signals, and to provide an output signal to serve as the error signal to drive said polarization servo means.

6. A fiber optics device in accordance with claim 5, wherein said mirror is a partially reflecting planar mirror, and wherein the analyzer unit comprises a polarimeter which includes a λ/4 plate and a Wollaston prism, the axes of which plate and prism are displaced 45° with respect to one another, wherein the λ/4 plate is located between said partially reflecting planar mirror and said Wollaston prism, and wherein the polarimeter further includes photodiodes to record the intensities of two output light currents exiting, at different angles, from the Wollaston prism.

7. A fiber optics device in accordance with claim 2 or 3, wherein said polarization servo means is a pressure device coupled adjacent to the second end of the fiber to compress a short end section of said fiber with a force which is composed additively of a constant bias-stress and a variable quantity which is proportional to the error signal.

8. A fiber optics device in accordance with claim 5, wherein said polarization servo means is a pressure device coupled adjacent to the second end of the fiber to compress a short end section of said fiber with a force which is composed additively of a constant bias-stress and a variable quantity which is proportional to the error signal.

9. A fiber optics device in accordance with claim 6, wherein said polarization servo means is a pressure device coupled adjacent to the second end of the fiber to compress a short end section of said fiber with a force which is composed additively of a constant bias-stress and a variable quantity which is proportional to the error signal.

10. A fiber optics device in accordance with claim 7, wherein the pressure device features two pressure jaws which are adjacent to the fiber and which are located at diametrically opposing positions along said fiber, and further wherein the improvement further comprises means for producing control power for said pressure jaws which is proportional to the error signal.

11. A fiber optics device in accordance with claim 10, wherein said control power producing means comprises an electromagnet.

12. A fiber optics device in accordance with claim 10, wherein said control power producing means comprises a piezoelectric element.

13. A fiber optics device in accordance with claim 3, wherein the polarization servo component comprises an electro-optical element with electrically controllable birefringence, which is located between said second fiber end and said mirror, which electro-optical element has an optical axis which runs at right angles to the propagation direction of the light exiting from the second end of the fiber, and wherein said error signal is applied along said optical axis of said electro-optical element.

14. A fiber optics device in accordance with claim 13, wherein said electro-optical element comprises a LiNbO$_3$ crystal.

15. A fiber optics device in accordance with claim 1, wherein said mirror is a partially reflecting mirror, and further wherein said analyzer unit is arranged to record the polarization state of the light received by the mirror by analyzing the light which passes through said partially reflecting mirror.

16. A fiber optics device in accordance with claim 1, wherein said analyzer unit is arranged to record the polarization state of the light received by the mirror by analyzing light reflected from the mirror.

* * * * *